(12) United States Patent
Leussler et al.

(10) Patent No.: US 7,221,160 B2
(45) Date of Patent: May 22, 2007

(54) MR DEVICE PROVIDED WITH DIFFERENTLY OPTIMIZED RF COIL ARRAYS

(75) Inventors: Christoph Günther Leussler, Hamburg (DE); Peter Börnert, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/517,929

(22) PCT Filed: Jun. 10, 2003

(86) PCT No.: PCT/IB03/02201

§ 371 (c)(1),
(2), (4) Date: Dec. 14, 2004

(87) PCT Pub. No.: WO03/107026

PCT Pub. Date: Dec. 24, 2003

(65) Prior Publication Data

US 2006/0061360 A1   Mar. 23, 2006

(30) Foreign Application Priority Data

Jun. 14, 2002 (DE) ............................... 102 26 488

(51) Int. Cl.
*G01V 3/00* (2006.01)
(52) U.S. Cl. ................................................ 324/318
(58) Field of Classification Search ............... 324/307, 324/318
See application file for complete search history.

(56) References Cited

U.S. PATENT DOCUMENTS

| | | | | |
|---|---|---|---|---|
| 5,945,826 A | * | 8/1999 | Leussler | 324/309 |
| 6,518,760 B2 | * | 2/2003 | Fuderer et al. | 324/307 |
| 6,556,010 B2 | * | 4/2003 | Van Den Brink et al. | 324/309 |
| 6,975,115 B1 | * | 12/2005 | Fujita et al. | 324/318 |
| 2002/0060567 A1 | * | 5/2002 | Harvey et al. | 324/307 |
| 2002/0169374 A1 | * | 11/2002 | Jevtic | 600/422 |

FOREIGN PATENT DOCUMENTS

| | | |
|---|---|---|
| EP | 0 390 476 | 10/1990 |
| JP | 9-206288 | 8/1997 |

(Continued)

OTHER PUBLICATIONS

Greenman, et al.; Bilateral Imaging Using Separate Interleaved 3D Volumes and Dynamically Switched Multiple Receive Coil Arrays; 1998; MRM;39:108-115.

(Continued)

*Primary Examiner*—Brij Shrivastav
*Assistant Examiner*—Megann E Vaughn
(74) *Attorney, Agent, or Firm*—Thomas M. Lundin

(57) ABSTRACT

An MR device for MR imaging includes an RF coil system. In order to enable switching to and fro between different applications in such an MR device without having to move the patient so as to position a new RF coil system, it is proposed to provide the RF coil system for the transmission and/or reception of RF signals with at least two RF coil arrays which are integrated in one coil former and have been optimized for different applications, each RF coil array comprising at least two RF coils which are decoupled from one another.

16 Claims, 9 Drawing Sheets

FOREIGN PATENT DOCUMENTS

| | | |
|---|---|---|
| WO | WO 98/21600 | 5/1998 |
| WO | WO 99/54746 | 10/1999 |
| WO | WO 00/72034 | 11/2000 |

OTHER PUBLICATIONS

Kocharian, et al.; Simultaneous Image Acquisition Utilizing Hybrid Body and Phased Array Receiver Coils; 2000; MRM; 44:660-663.

Porter, et al.; A Modular Time Domain Multiplexer for Large Array Magnetic Resonance Imaging; 1994; IEEE; 564-565.

Pruessmann, et al.; SENSE: Sensitivity Encoding for Fast MRI; 1999; MRM; 42:952-962.

Stappert, et al.; SENSE with Combined Surface-and-Volume-Coils for MRI; Research Disclosure No. 442016; 2001.

\* cited by examiner

MR DEVICE PROVIDED WITH DIFFERENTLY OPTIMIZED RF COIL ARRAYS

BACKGROUND

The invention relates to a magnetic resonance (MR) device for MR imaging as well as to an RF coil system for such an MR device.

MR devices of this kind are generally known and described in numerous documents, for example, in U.S. Pat. No. 6,377,045 which discloses a magnetic resonance device for carrying out the SENSE method by means of an RF coil array. The optimization of RF coil arrays is of major importance for MR imaging. For given clinical protocols a specific optimization of the image quality can be achieved by parameter variation of the coil number, the coil configuration and the arrangement of the coils. The object basically consists of obtaining a maximum signal-to-noise ratio (SNR). A high SNR in deeper layers is achieved by means of RF coils having a given minimum size. However, the maximum number of RF coils in relation to the given size of the object to be examined, for example, a patient, is thus limited. When using parallel imaging methods, such as SENSE or SMASH the number of RF coils is increased so as to obtain a high reduction factor for a corresponding temporal resolution.

It can be stated in principle that the design criteria for RF coils differ significantly in dependence on the relevant application and the imaging method. For example, when the SENSE imaging method is used, a low error propagation rate should be achieved in combination with a high reduction factor, whereas maximization of the SNR is most important when synergy coils are used. It follows therefrom that an RF coil array which has been optimized for the SENSE method also deviates geometrically from a synergy coil array in respect of the number, the size and the position of the RF coils.

For clinical applications it is desirable that switching over between and selection of different applications and imaging methods can take place at will without it being necessary to move the patient in order to fit a new RF coil array. Therefore, it is an object of the invention to provide an MR device as well as an RF coil system for such an MR device which enable such selection and switching.

SUMMARY

This object is achieved by means of an MR device which includes:
- a main field magnet for generating a steady main magnetic field;
- a gradient coil system with a plurality of gradient coils for generating magnetic gradient fields;
- an RF coil system for transmitting and/or receiving RF signals, which coil system includes at least two RF coil arrays which are integrated in one coil former and have been optimized for different applications, each RF coil array comprising at least two RF coils decoupled from one another;
- a transmit/receive unit for driving the RF coil arrays and for receiving MR signals from the RF coil arrays, there being provided a plurality of channels, notably a number of channels which corresponds to the number of RF coils of the RF coil array comprising the largest number of RF coils;
- a control unit for controlling the MR imaging, the control unit being arranged to switch over the RF coil arrays for temporally separate use of the individual RF coil arrays during the MR data acquisition; and
- a processing unit for processing received MR signals.

The simultaneous integration of RF coil arrays optimized for different applications in one coil former in accordance with the invention offers major advantages. During an examination it is no longer necessary to move the patient, or even to move the patient to a different bed, when the application of a different MR imaging method is desired; the overall examination time is thus reduced. The different RF coil arrays can now be specifically selected separately for given clinical applications. For example, when the different RF coil arrays are suitably optimized, an optimum can be achieved as regards the SNR and/or the highest temporal resolution.

In the MR device in accordance with the invention at least the RF coils within the individual RF coil arrays are decoupled from one another. One RF coil array can thus be used at any time for the excitation (in the transmit mode) or for the acquisition of MR signals (in the receive mode), so that the RF coils of the other RF coil arrays are electronically switched off. The switching over between the individual RF coil arrays can be carried out directly from a control console for the relevant imaging protocol or by the relevant imaging sequence itself.

In a preferred embodiment it is also arranged that the individual RF coil arrays are also decoupled from one another, so that the individual RF coils of all different RF coil arrays are also decoupled from one another. As a result, in as far as there is provided a correspondingly large number of channels in the transmit/receive unit, MR signals can be received in parallel from all RF coils. Appropriate switching means may be provided so as to enable switching over at will between RF coils of different RF coil arrays in the case where the total number of RF coils is larger than the total available number of channels of the transmit/receive unit. This enables the simultaneous application of different imaging methods during one MR data acquisition; this is of special interest for special applications.

In conformity with a further embodiment, a first RF coil array is advantageously optimized for the SENSE method or the SMASH method and a second RF coil array is optimized as a synergy coil array. With respect to the SENSE method, reference is made to the publication by K. Prüssmann "SENSE: Sensitivity Encoding for Fast MRI", Magnetic Resonance in Medicine 42: 952–962 (1999) and U.S. Pat. No. 6,326,786 in which this method is described in detail. The SMASH method is described in U.S. Pat. No. 5,910,728. The RF coil array for SENSE or SMASH methods is then optimized in order to achieve a reduction of the acquisition time, whereas a synergy coil array is intended to achieve a maximum signal-to-noise ratio. A synergy coil array described in U.S. Pat. No. 5,945,826 and U.S. Pat. No. 5,600,244.

In conformity with other embodiments, the RF coils of the SENSE or the SMASH RF coil arrays are situated nearer to the object to be examined, are smaller in size and larger in number and are arranged so as to overlap one another, as opposed to the RF coils of the synergy coil array which are preferably arranged so as that they do not overlap one another.

Generally speaking, switching over between the various RF coil arrays in conformity with the clinical protocol can take place after the acquisition of complete sets of image data. However, it may also be arranged that all RF coils are connected to a separate channel of the transmit/receive unit and that the control unit is arranged for the simultaneous acquisition of MR signals by means of RF coils of different RF coil arrays. MR signals can thus be acquired simultaneously from different regions and with a different destination direction, thus enabling advantageous applications. For example, it is feasible to reconstruct images in real time already during the MR data acquisition, for example, from MR data acquired by an RF coil array which has been optimized for the SENSE method. Images of this kind then depict changes of the object to be examined with a high temporal resolution as is of interest, for example, for MR angiography. Such real-time data can also be fed back to the data acquisition so as to enable motion correction or control of the data acquisition in general.

It is in principle also possible to switch over the mutually decoupled RF coil arrays within an imaging sequence (switching time approximately 100 µs). New methodic protocols can thus be applied, enabling the use of the different RF coil arrays for the data acquisition from only sub-regions of the k space. For example, the data of the central k space can be measured with a high SNR, for example, by means of a synergy coil array, whereas the high k spatial frequencies are acquired at a high speed, for example, by means of a SENSE RF coil array. The corresponding images can be acquired by way of a suitable calibration, for example, of the SENSE coil array to the synergy coil array, and an adapted reconstruction. The use of an MR device thus elaborated, enables combination of the advantages of a reduction of the measuring time and a maximum SNR.

Advantages of the present application will be apparent to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
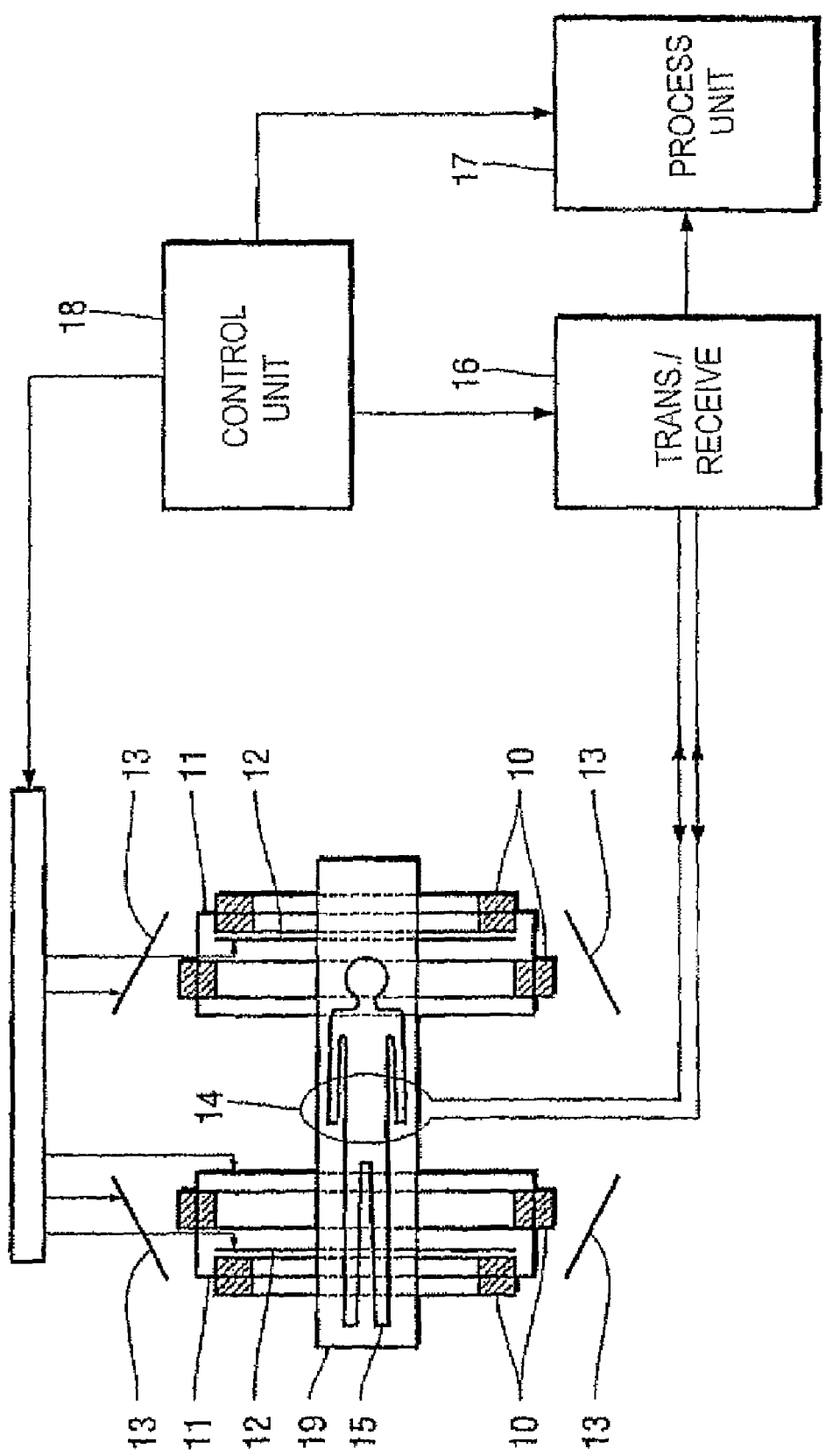
FIG. 1 is a diagrammatic representation of an MR device in accordance with the invention.

FIG. 1 is a diagrammatic representation of an MR device in accordance with the invention for forming MR images of the patient 15 who is arranged on a patient table 19 in the examination zone. The MR device includes a main field magnet system 10 with a plurality of main field magnets which generate a steady, uniform magnetic field in the longitudinal direction of the patient 15. A gradient coil system with a plurality of gradient coils 11, 12, 13 is provided so as to generate magnetic gradient fields. Furthermore, an RF coil system 14 is provided to generate RF excitation pulses and to acquire MR signals from the excited examination zone, the construction of said RF coil system in accordance with the invention being described in detail hereinafter. A transmit/receive unit 16 is provided in order to control the individual RF coils of the RF coil system 14 in the transmit mode or the receive mode for the MR signals received by the individual RF coils. The MR signals received are processed by a processing unit 17 so as to form desired MR images. Finally, a control unit 18 is provided for the control of the transmit/receive unit 16, the processing unit 17 and the various coil systems 10 to 14. Further details of the basic construction of such an MR device as well as of its operating principle are generally known, for example, from the previously mentioned U.S. Pat. 6,377,045 and, therefore, will not be elaborated herein.

Figure 2A:
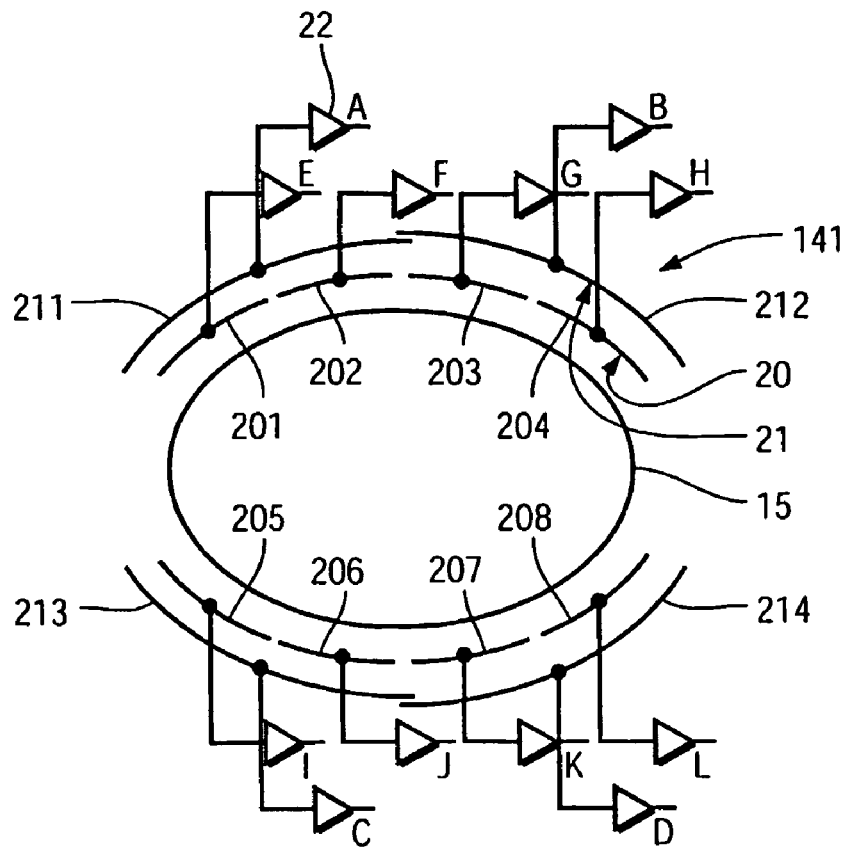
FIG. 2a shows a first embodiment of an RF coil system in accordance with the invention.

FIG. 2a shows a first embodiment of an RF coil system 141 in accordance with the invention. The Figure shows two RF coil arrays 20, 21 which are formed as surface coils and are arranged one over the other around the patient 15 who is shown in a cross-sectional view. The RF coil array 20 which is nearest to the patient 15 includes a total number of eight RF coils 201 to 208 which are arranged adjacent one another and without overlapping one another. These coils have been optimized for application of the SENSE technique. On these coils there are arranged the four RF coils 211 to 214 of the second RF coil array 21, that is, in such a manner that each time two RF coils slightly overlap one another and that all RF coils 201 to 208 of the first RF coil array 20 are covered. The RF coils 211 to 214 are configured as synergy coils. Coil elements of a synergy coil array (usually surface coils) receive MR signals from object areas in the vicinity of the coils, with an improved signal-to-noise ratio in comparision to a whole-body coil. See, for example. U.S. Pat No. 5,945,826 and U.S. Pat No. 5,600,244.

Figure 2B:
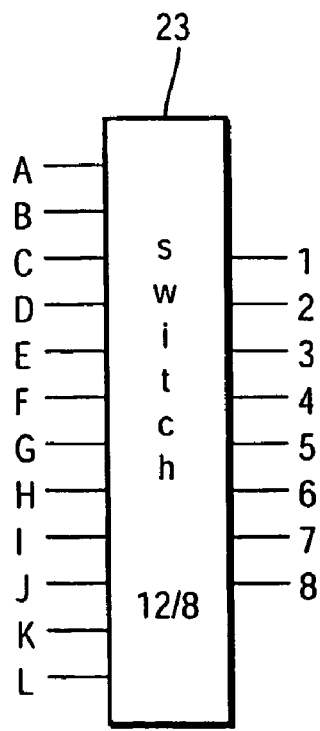
FIG. 2b shows an associated switching unit.

Each of the RF coils 201 to 208 and 211 to 214 is connected to a respective preamplifier 22, so that there are twelve connection points A to L in total. In as far as the transmit/receive unit (16 in FIG. 1) comprises only eight channels, in this case a switching unit 23 as shown in FIG. 2b can be used to switch the twelve connection points A to L correctly to the eight channels 1 to 8. The switching unit 23 is also controlled by the control unit 18 for this purpose.

Figure 3:
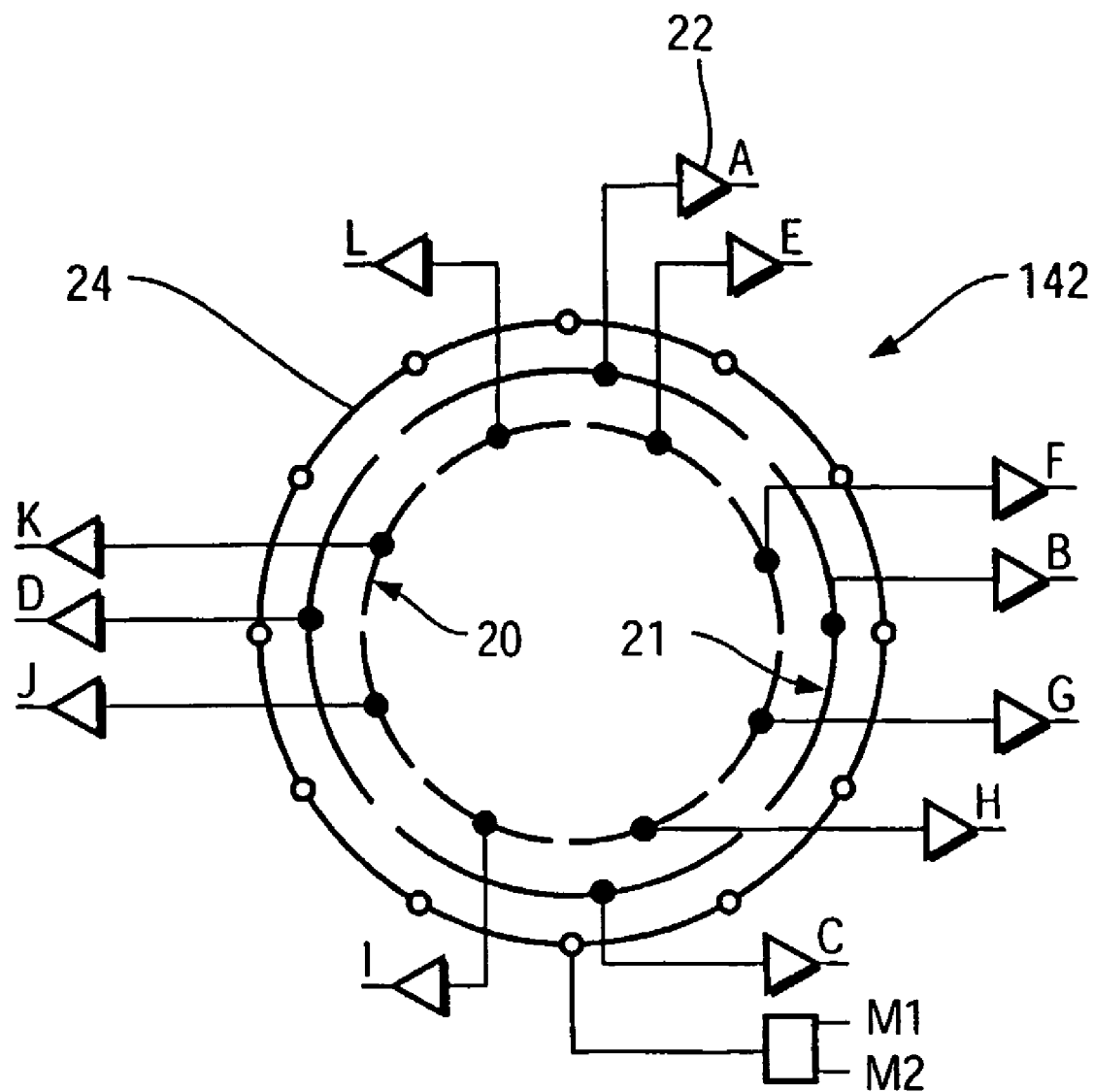
FIG. 3 shows a second embodiment of an RF coil system in accordance with the invention.

FIG. 3 shows a further embodiment of an RF coil system 142 in accordance with the invention. In addition to the RF coil systems 20 and 21 shown in FIG. 2a, the RF coil system 142 includes a head volume coil 24, being a so-called birdcage coil, which encloses the two RF coil arrays 20, 21. This embodiment is intended in particular for the acquisition of MR images of the head of a patient. For the head volume coil 24 there is also provided a separate preamplifier 22 with a separate input M1 (for transmission) and an output M2.

Figure 4A:
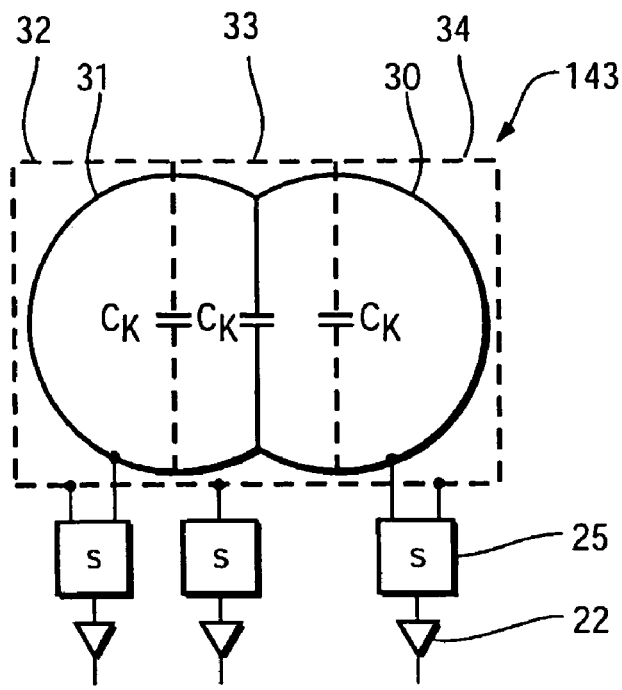
FIGS. 4a, b show a third and a fourth embodiment, respectively, of an RF coil system in accordance with the invention with switching means.
Figure 4B:
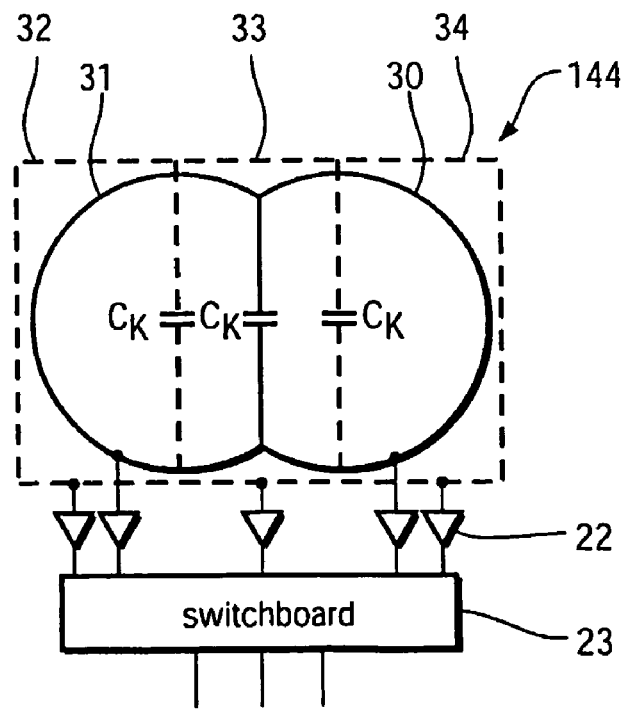

Two further embodiments of an RF coil system 143, 144 in accordance with the invention are shown in the FIGS. 4a, 4b. Fewer channels are required in these embodiments, because appropriate switching means 25 and 23 are provided in front of or behind the preamplifiers 22. Each of the embodiments 143, 144 shown is provided with two synergy coils 30, 31 and three SENSE coils 32, 33, 34, decoupling capacitances $C_K$ being provided for the decoupling of the RF coils. Alternatively, other means such as, for example, λ/2 leads or transformers may be provided for the decoupling. The embodiments shown are suitable in particular for cardiac examinations. It may also be arranged that only a part of the RF coil system consists of a combination of two RF coil arrays, whereas another part of the RF coil system constitutes a conventional surface coil.

Figure 5:
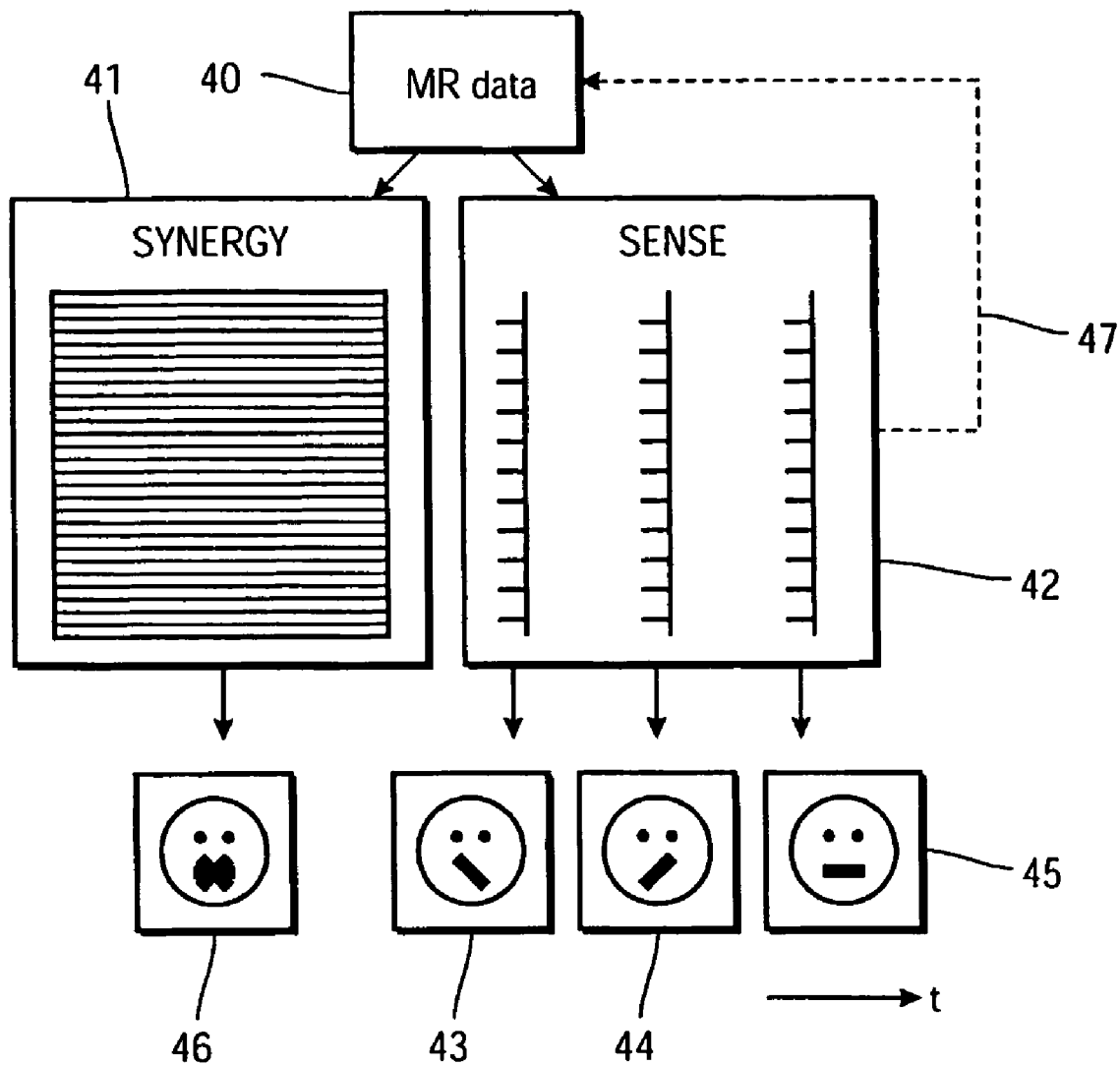
FIG. 5 shows a diagram illustrating an application of the MR device in accordance with the invention.

An advantageous application of an MR device in accordance with the invention, in which all RF coils of the RF coil system used are decoupled from one another so that in principle MR signals can be received from all RF coils simultaneously, will be described in detail hereinafter with reference to FIG. 5. In this respect it is assumed that a synergy coil array and a SENSE coil array are provided. The MR data 40 acquired includes synergy coil data 41 on the one hand and SENSE coil data 42 on the other hand. The k space as well as the filling of the k space with the acquired MR data are shown each time symbolically. The SENSE data 42 can be used for the reconstruction in real time, during the data acquisition (of the synergy data 41), of images 43, 44, 45 from the k space data sets which are interleaved in different ways and reflect with a high temporal resolution the changes of the object to be measured. The real-time data can, moreover, be fed back to the MR data acquisition (feedback 47), for example, in order to carry out a motion correction or a general control of the data acquisition. Finally, a conventional MR image 46 with a high signal-to-noise ratio can also be reconstructed from the synergy coil data 41. It is to be noted that this procedure is not limited to the combination of a synergy coil system and a SENSE coil system and that it can in principle be used also in the case of combination of other RF coil arrays.

RF coil arrays are used in principle to enhance the signal-to-noise ratio. The duration of the image acquisition in principle is not affected thereby. The previously mentioned SENSE and SMASH methods reduce the acquisition time for an MR image at the expense of the SNR. In both methods the Field Of View (FOV) is reduced, thus giving rise to backfolding or aliasing. The images acquired contain aliasing artifacts which must be corrected again at a later stage. This is done by means of the MR data acquired from the individual n RF coils of the RF coil array, because they "see" one of n pixels differently.

The SENSE method solves a system of equations pixel-by-pixel from the images of the individual RF coils with different profiles, whereas the SMASH method yields a system of equations for an entire MR image. The SMASH method utilizes in the simplest case a linear RF coil array of RF coils and synthesizes a plurality of sinusoidal harmonics from the coil sensitivities. These harmonics produce an offset in the k space like a B0 gradient field. Therefore, hypothetically speaking, the reconstruction time for the SMASH method is shorter than for the SENSE method, but this is "achieved" at the expense of the image quality. The SENSE method offers a better image quality. In principle, therefore, the two reconstruction methods can be used for a linear RF coil array. Because of the novel and fast hardware reconstruction units available nowadays, the reconstruction time no longer poses a problem in respect of temporal resolution in the case of the SENSE method.

Synergy coils serve first of all to produce an optimum signal-to-noise ratio. This, of course, also holds for SENSE coils, but now it is not necessary to observe the secondary condition as regards a suitable solution of the system of equations for the reconstruction. Generally speaking, clinically a high SNR is required with as few artifacts as possible, that is, an as high as possible SNR and intensity distribution across the entire FOV. This is achieved in principle already by means of a small number of RF coils. The combination of these RF coils so as to form an overall image provides an SNR for the center which could not be increased significantly further by increasing the number of RF coils.

Figure 6A:
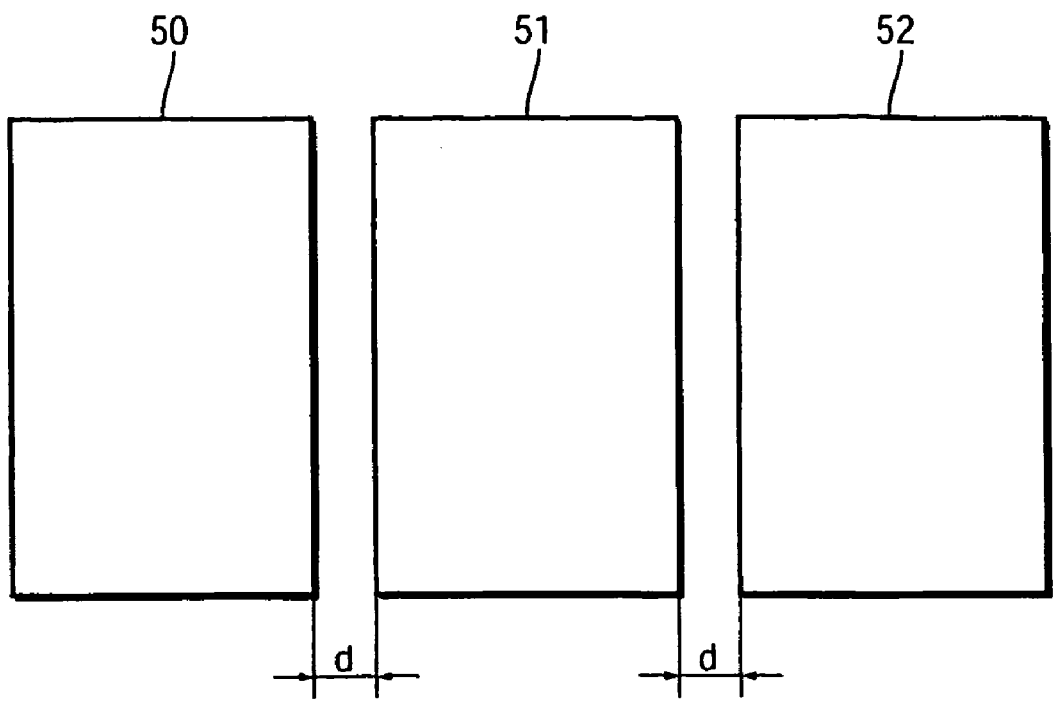
FIGS. 6a to e are various views of a SENSE RF coil array.
Figure 6B:
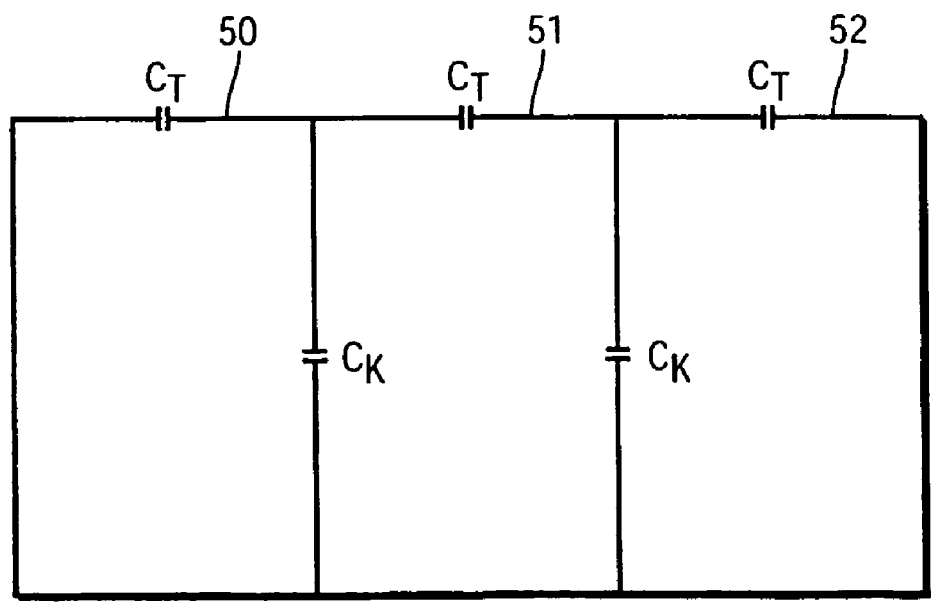
Figure 6C:
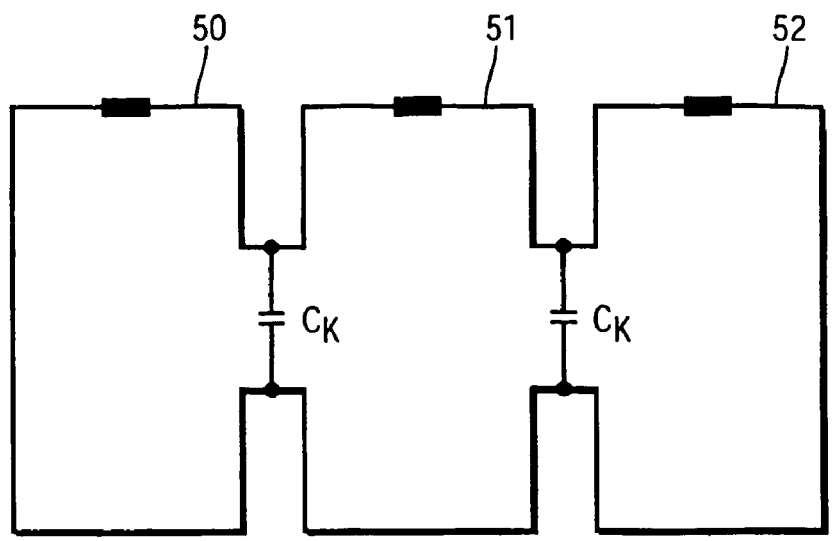
Figure 6D:
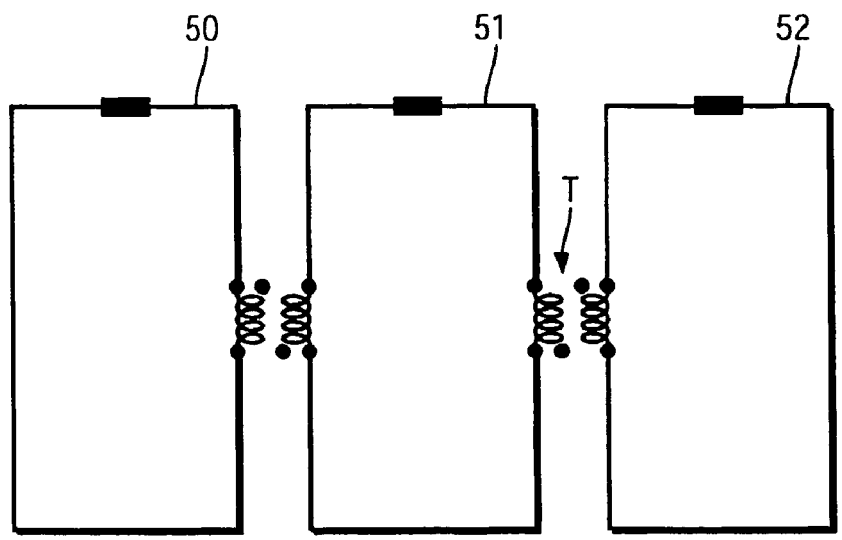
Figure 6E:
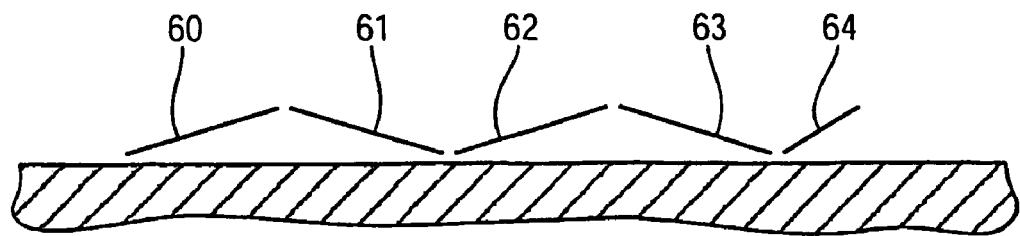

A synergy coil array of this kind can in principle also be used for the SENSE method. In order to obtain a high temporal resolution, the RF coils can be subjected to modifications which are less suitable for an optimum uniform image quality. On the one hand the individual SENSE coils are not arranged so as to overlap one another, but are situated at a given distance from one another, for example, in conformity with FIG. 6a which shows three SENSE coils 50, 51, 52 which are situated at a distance d of, for example, from 5 to 10 mm from one another. As is shown in FIG. 6b, decoupling capacitances $C_K$ are provided for the decoupling of the three coils 50, 51, 52, whereas appropriate resonance capacitances $C_T$ are provided for adjustment of the resonance. Two further embodiments of a SENSE RF coil array with capacitive decoupling and inductive decoupling by means of local RF transformers T, respectively, are shown in the FIGS. 6c and d. The RF coils may also be arranged so as to be tilted relative to one another as is shown on the basis of five SENSE coils 60 to 64 in FIG. 6e. Moreover, the number of RF coils should be as large as possible.

The FIGS. 7a to 7g are diagrammatic representations of further embodiments of an RF coil system in accordance with the invention. The FIGS. 7a and 7b both show four synergy coils 70 to 73 with a respective preamplifier 22. Each of the coils 70 to 73 is decoupled by means of decoupling capacitances $C_K$, but connected together in a different way.

Figure 7A:
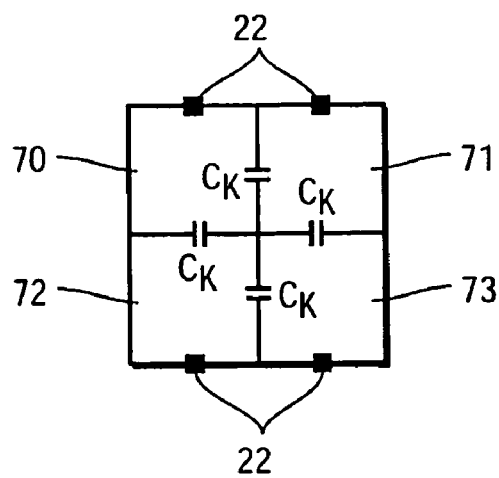
FIGS. 7a to g show different versions of RF coil arrays in accordance with the invention.
Figure 7B:
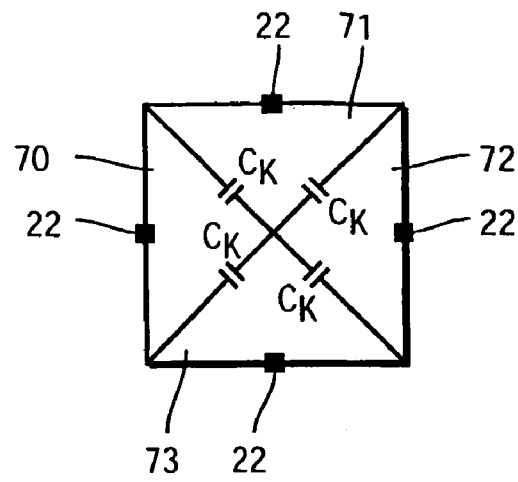
Figure 7C:
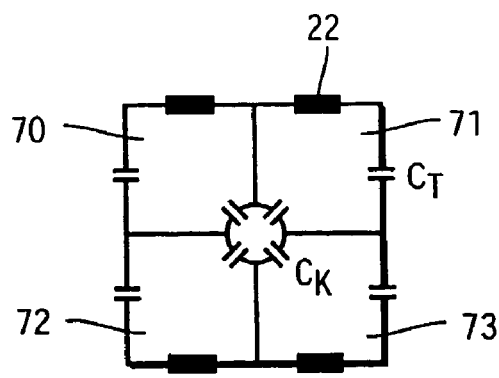
Figure 7D:
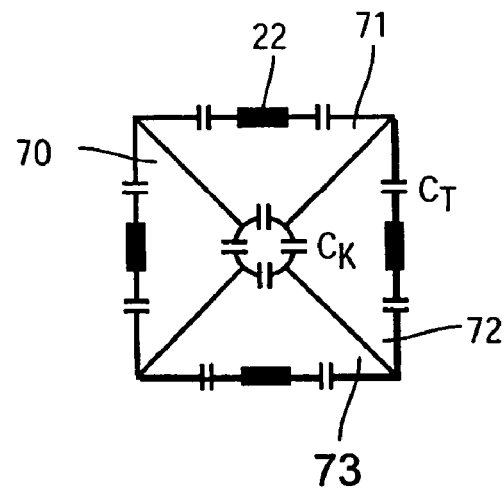

The FIGS. 7c and 7d show two further synergy coil arrays with each time four synergy coils 70 to 73. The decoupling capacitors $C_K$ therein are arranged each time at the center. For tuning there each time a different number of tuning capacitors $C_T$ is provided again.

Figure 7E:
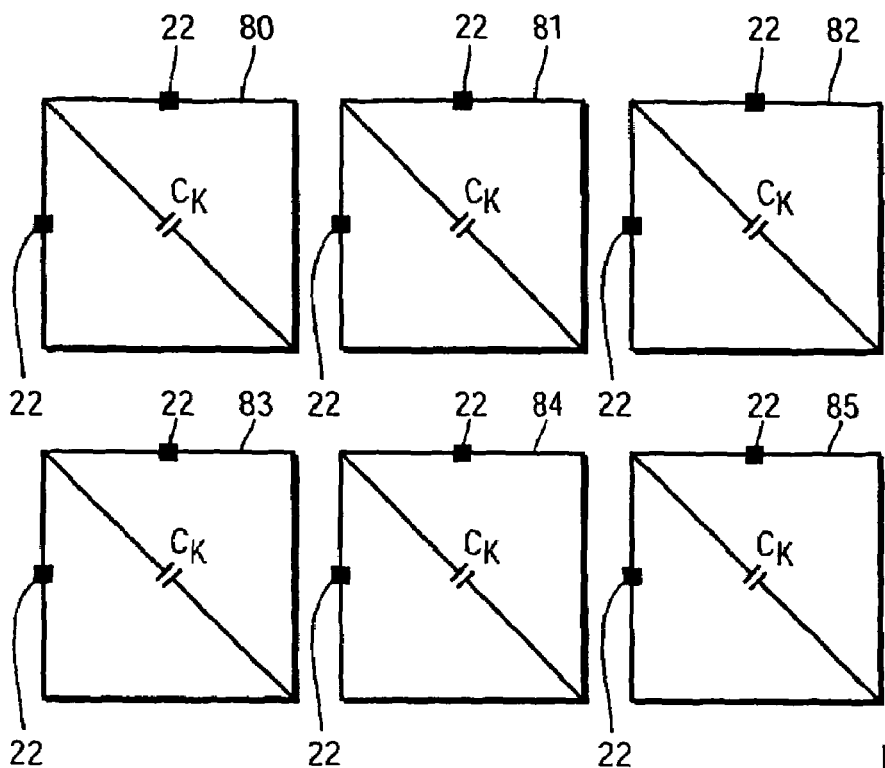

FIG. 7e shows a further embodiment of a SENSE RF coil array. This array comprises six coil pairs 80 to 85, each of which comprises two RF coils, which are decoupled via a decoupling capacitance $C_K$, and also each time two preamplifiers. The coil pairs 80 to 85 are decoupled from one another via the distance and the high-ohmic input resistance of the preamplifiers 22.

Figure 7F:
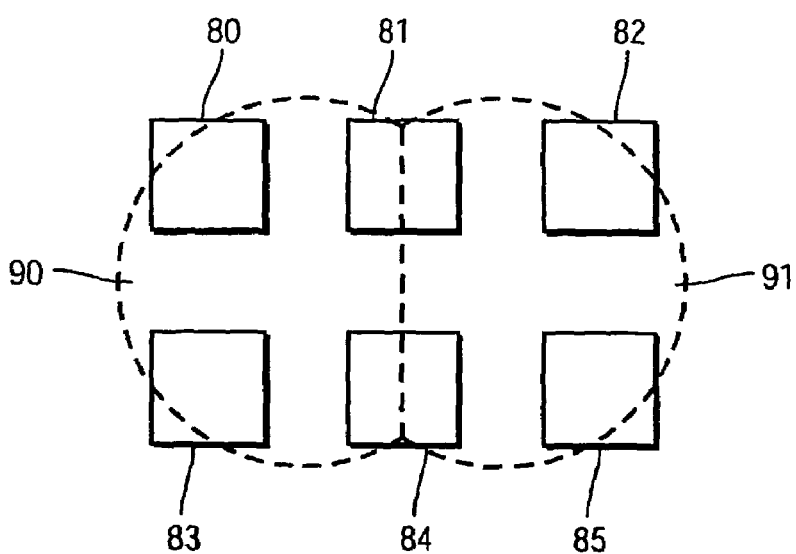

FIG. 7f shows a combination of a SENSE RF coil array as shown in FIG. 7e and a synergy coil array. The eight coil pairs 80 to 85 are covered substantially completely by the synergy coil array which consists of two synergy coils 90, 91. Of course, other SENSE coils as well as a different number and arrangement of SENSE coils or synergy coils can also be coupled to one another.

Figure 7G:
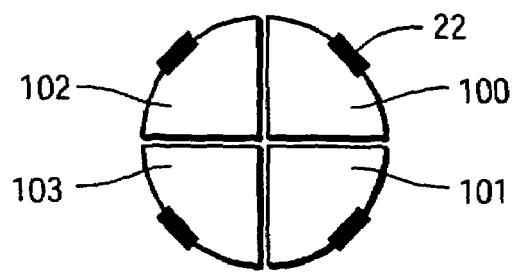

FIG. 7g shows an alternative SENSE or SMASH RF coil array with four SENSE RF coils 100, 102, 102, 103. Such an RF coil array is preferably combined with a synergy coil in the form of a large loop coil.

In accordance with the invention at least two RF coil arrays which have been optimized for different applications are integrated in one coil former. The construction of such combined RF coil arrays may, for example, take the form of a sandwich. Various solutions are feasible in respect of the number, the arrangement and the configuration of the individual RF coils or the RF coil arrays, so that various novel MR imaging methods become feasible. Overall the MR device in accordance with the invention offers a substantial reduction of the data acquisition time and enhances the ease of operation at the same time.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. An MR device for MR imaging, which device includes:
   a main field magnet for generating a steady main magnetic field;
   a gradient coil system with a plurality of gradient coils for generating magnetic gradient fields;
   an RF coil system for transmitting and/or receiving RF signals, which coil system includes at least two RF coil arrays which are integrated in one coil former and have been optimized for different applications, each RF coil array comprising at least two RF coils decoupled from one another;
   at least one of the RF coil arrays is optimized for parallel imaging;
   a transmit/receive unit for driving the RF coil arrays and for receiving MR signals from the RF coil arrays, there being provided a plurality of channels, notably a number of channels which corresponds to the number of RF coils of the RF coil array comprising the largest number of RF coils;
   a control unit for controlling the MR imaging, the control unit being arranged to switch over the RF coil arrays for temporally separate use of the individual RF coil arrays during the MR data acquisition; and
   a processing unit for processing received MR signals.

2. An MR device as claimed in claim 1, wherein the at least two RF coil arrays are decoupled from one another.

3. An MR device as claimed in claim 1, wherein each of the RF coils is connected to a separate channel of the transmit/receive unit and that the control unit is arranged for the simultaneous acquisition of MR signals by means of RF coils of different RF coil arrays.

4. An MR device as claimed in claim 3, wherein there provided means for feeding back MR signals acquired and evaluated in real time to the control unit so as to change the control of the instantaneous MR data acquisition in conformity with the MR signals acquired and evaluated in real time.

5. An MR device as claimed in claim 3, wherein the control unit is arranged to acquire MR signals from a first sub-region of the k space by means of a first RF coil array, notably for the acquisition of MR signals from the central region of the k space by means of a synergy coil array, and to acquire MR signals from a second sub-region of the k space by means of a second RF coil array, notably for the acquisition of MR signals from edge regions of the k space by means of a SENSE RF coil array or a SMASH RF coil array.

6. The MR device as claimed in claim 1, further including a birdcage coil connected with the transmit/receive unit.

7. The MR device as claimed in claim 6, wherein the birdeage coil is integrated into one coil former with the at least two RF coil arrays.

8. The MR device as claimed in claim 7, wherein a first of the coil arrays is optimized for parallel imaging, notably SENSE or SMASH.

9. The MR device as claimed in claim 8, wherein a second of the RF coil arrays includes a plurality of RF coils which are optimized to receive signals together synergistically.

10. An MR device for MR imaging, which device includes:
    a main field magnet for generating a steady main magnetic fied;
    a gradient coil system with a plurality of gradient coils for generating magnetic gradient fields;
    a local RF coil system for transmitting and/or receiving RF signals, which coil system includes at least a first RF coil array that has been optimized for the SENSE method or the SMASH method and a second RF coil array that has been optimized as a coil array for imaging with a method different from the SENSE or SMASH methods, the first and second coil arrays being integrated in a single, common coil, each RF coil array comprising at least two RF coils and being decoupled from one another;
    a transmit/receive unit for at least one of driving the RF coil arrays and for receiving MR signals from the RF coil arrays, there being provided a plurality of channels, notably a number of channels which is at least a number of RF coils of the first RF coil array;
    a control unit for controlling the MR imaging, the control unit being arranged to switch between the RF coil arrays for temporally separate use of the individual RF coil arrays during MR data acquisition; and
    a processing unit for processing the acquired MR data.

11. An MR device as claimed in claim 10, wherein the RF coils of the SENSE RF coil array or the SMASH RF coil array are arranged in the coil former in such a manner that they are situated nearer to the object to be examined than the RF coils of the second coil array.

12. An MR device as claimed in claim 10, wherein the SENSE RF coil array or the SMASH RF coil array comprises more and smaller RF coils than the second coil array.

13. An MR device as claimed in claim 10, wherein the RF coils of the second coil array are arranged so as to overlap one another and that the RF coils of the SENSE RF coil array or the SMASH RF coil array are arranged so that they do not overlap one another.

14. The MR device as claimed in claim 10, further including a birdcage coil connected with the transmit/receive unit.

15. An RF coil system for an MR device for the transmission and/or reception of RF signals for MR imaging, which MR device includes
    a main field magnet for generating a steady main magnetic field;
    a gradient coil system with a plurality of gradient coils for generating magnetic gradient fields;
    a transmit/receive unit with a plurality of channels for transmitting and receiving MR signals;
    a control unit for controlling the MR imaging, the control unit being arranged to switch the RF coil arrays for temporally separate use of the individual RF coil arrays during the MR data acquisition; and
    a processing unit for processing received MR signals, the RF coil system comprising:
    at least two RF coil arrays which are integrated in one coil former and have been optimized for different applications, at least one of the RF coil arrays includes a plurality of RF coils which are optimized to receive signals synergistically, each RF coil array comprising at least two RF coils which are decoupled from one another, the transmit/receive unit being provided with a number of channels which corresponds to the number of RF coils of the RF coil array comprising the largest number of RF coils.

16. The MR device as claimed in claim 15, wherein at least one of the RF coil arrays is optimized for parallel imaging, such as SENSE or SMASH.

* * * * *